(12) United States Patent
Schleichert et al.

(10) Patent No.: US 9,988,706 B2
(45) Date of Patent: Jun. 5, 2018

(54) AUTOMOTIVE COMPONENTS FORMED OF SHEET METAL COATED WITH A NON-METALLIC COATING

(71) Applicant: MAGNA INTERNATIONAL INC., Aurora (CA)

(72) Inventors: Edward William Schleichert, Munich (DE); Alexander Zak, Troy, MI (US)

(73) Assignee: Magna International Inc., Aurora, Ontario (CA)

( * ) Notice: Subject to any disclaimer, the term of this patent is extended or adjusted under 35 U.S.C. 154(b) by 500 days.

(21) Appl. No.: 14/396,333

(22) PCT Filed: May 3, 2013

(86) PCT No.: PCT/US2013/039529
§ 371 (c)(1),
(2) Date: Oct. 22, 2014

(87) PCT Pub. No.: WO2013/166429
PCT Pub. Date: Nov. 7, 2013

(65) Prior Publication Data
US 2015/0292075 A1 Oct. 15, 2015

Related U.S. Application Data

(60) Provisional application No. 61/642,113, filed on May 3, 2012.

(51) Int. Cl.
C23C 14/02 (2006.01)
C23C 14/00 (2006.01)
(Continued)

(52) U.S. Cl.
CPC .............. *C23C 14/025* (2013.01); *C21D 9/00* (2013.01); *C23C 14/0036* (2013.01);
(Continued)

(58) Field of Classification Search
CPC ... C23C 14/025; C23C 14/0036; C23C 14/06; C23C 28/30; C23C 28/34; C23C 14/0605; C23C 14/22; C21D 9/00
See application file for complete search history.

(56) References Cited

U.S. PATENT DOCUMENTS 4,568,614 A 2/1986 Eichen et al.
6,564,604 B2 5/2003 Kefferstein
(Continued)

FOREIGN PATENT DOCUMENTS

CA 2806263 A1 2/2012
WO 2011016518 A1 2/2011
(Continued)

OTHER PUBLICATIONS

Dosdat, L. et al., Corrosion Resistance of Different Metallic Coatings on Press-Hardened Steels for Automotive, Steel Research International, www.steelresearch-journal.com, Jun. 1, 2011, pp. 726-733, vol. 82, No. 6, Wiley-VCH Verlad GmbH & Co., KGaA, Weinheim.

*Primary Examiner* — Jonathan Langman
(74) *Attorney, Agent, or Firm* — Dickinson Wright PLLC

(57) ABSTRACT

An automotive component (20) is manufactured by depositing a non-metallic coating (24) on a surface of a steel blank (26) before hot stamping the steel blank (26). The non-metallic coating (24) is typically applied by physical vapor deposition. The non-metallic coating (24) is formed of one to three layers (32) each having a different composition. The non-metallic coating (24) includes at least one of silicon and carbon, and can also include oxygen, nitrogen, ceramic compounds, and carbides. The total thickness of the non-metallic coating (24) is less than 300 nm. A metallic coating (30) can be applied to the steel blank before the non-metallic coating (24). The non-metallic coating (24) provides numerous advantages, including reduced scaling during the hot stamping process.

10 Claims, 3 Drawing Sheets

(51) Int. Cl.
 C23C 28/00 (2006.01)
 C23C 14/06 (2006.01)
 C23C 14/22 (2006.01)
 C21D 9/00 (2006.01)
(52) U.S. Cl.
 CPC .......... *C23C 14/06* (2013.01); *C23C 14/0605* (2013.01); *C23C 14/22* (2013.01); *C23C 28/30* (2013.01); *C23C 28/34* (2013.01)

(56) References Cited

U.S. PATENT DOCUMENTS

| | | | | |
|---|---|---|---|---|
| 2009/0081433 | A1* | 3/2009 | Lucas | C23C 16/0209 428/216 |
| 2011/0076477 | A1* | 3/2011 | Bradstatter | C21D 1/68 428/217 |
| 2011/0165436 | A1 | 7/2011 | Drillet et al. | |
| 2011/0300407 | A1* | 12/2011 | Cho | C23C 2/02 428/653 |
| 2012/0085466 | A1* | 4/2012 | Lupp | C23C 2/06 148/241 |
| 2012/0267012 | A1* | 10/2012 | Sohn | C23C 2/02 148/284 |
| 2014/0113146 | A1* | 4/2014 | Haack | B05D 5/068 428/425.5 |
| 2015/0064376 | A1* | 3/2015 | Smith | B05D 5/083 428/34.1 |

FOREIGN PATENT DOCUMENTS

| | | | | |
|---|---|---|---|---|
| WO | WO /2011/081392 | * | 7/2011 | ............... C23C 2/06 |
| WO | 2011101158 A1 | | 8/2011 | |

* cited by examiner

AUTOMOTIVE COMPONENTS FORMED OF SHEET METAL COATED WITH A NON-METALLIC COATING

CROSS-REFERENCE TO RELATED APPLICATIONS

This U.S. National Stage Patent Application claims the benefit of International Application Serial No. PCT/US2013/039529 filed May 3, 2013, entitled "Automotive Components Formed Of Sheet Metal Coated With A Non-Metallic Coating" which claims priority to U.S. Provisional Patent Application Ser. No. 61/642,113, entitled "Automotive Components Formed Of Sheet Metal Coated With A Non-Metallic Coating", filed May 3, 2012, the entire disclosures of the applications being considered part of the disclosure of this application, and hereby incorporated by reference.

BACKGROUND OF THE INVENTION

1. Field of the Invention

The subject invention relates to automotive components comprising hot formed steel, and methods of manufacturing the same.

2. Related Art

Automotive vehicle components are often manufactured by hot forming a steel blank, such as a cold rolled or hot rolled steel sheet. Examples of such automotive components include A-pillars, B-pillars, D-pillars, door beams, bumper beams, sills, rockers, fuel tank guards, skid shields, front rails, mid rails, rear rails, door frames, door inner reinforcement components, front tunnels, and wet area components, such as parts along the floor of the automotive vehicle. The hot forming process is conducted at a temperature greater than 700° C. and oftentimes includes hot stamping the steel sheet. The hot forming process increases mechanical strength and may enhance other physical properties of the steel sheet. However, due to the high temperatures employed during the hot forming process, white oxide formation, scaling, corrosive fouling, or decarburization of the surface of the steel sheet often occurs, which reduces mechanical strength and wears on the manufacturing tools used during the hot forming process. The white oxide formation, scaling, corrosive fouling, and decarburization of the surface also leads to poor adhesion and makes it difficult to paint the surface of the part. Although the hot formed steel part may be shot-blasted to remove the white oxides, scaling, and other surface defects, the shot blasting process requires a high amount of energy and may distort the steel part and increase costs.

SUMMARY OF THE INVENTION

One aspect of the invention provides an automotive component comprising a hot formed steel part, and a non-metallic coating disposed on a surface of the hot formed steel part. The non-metallic coating includes at least one of silicon and carbon and has a thickness of not greater than 300 nm.

Another aspect of the invention provides a method of forming the automotive component. The method includes providing a blank formed of a steel material; and hot forming the blank to provide a hot formed part. The method also includes disposing a non-metallic coating on a surface of the blank prior to the hot forming step. The non-metallic coating includes at least one of silicon and carbon and has a thickness of not greater than 300 nm.

The non-metallic coating prevents or reduces scaling, fouling, oxidation, and decarburization of the surface of the steel blank during the hot forming process. It also lubricates the surface and thus enhances formability. The non-metallic coating may also have a color and reflection factor providing quicker heating of the steel blank, compared to uncoated steel parts, or parts having a different coating. The non-metallic coating can also improve adhesion between the hot formed part and paint or another material applied to the part.

BRIEF DESCRIPTION OF THE DRAWING

Other advantages of the present invention will be readily appreciated, as the same becomes better understood by reference to the following detailed description when considered in connection with the accompanying drawing wherein.

DETAILED DESCRIPTION

Figure 1:
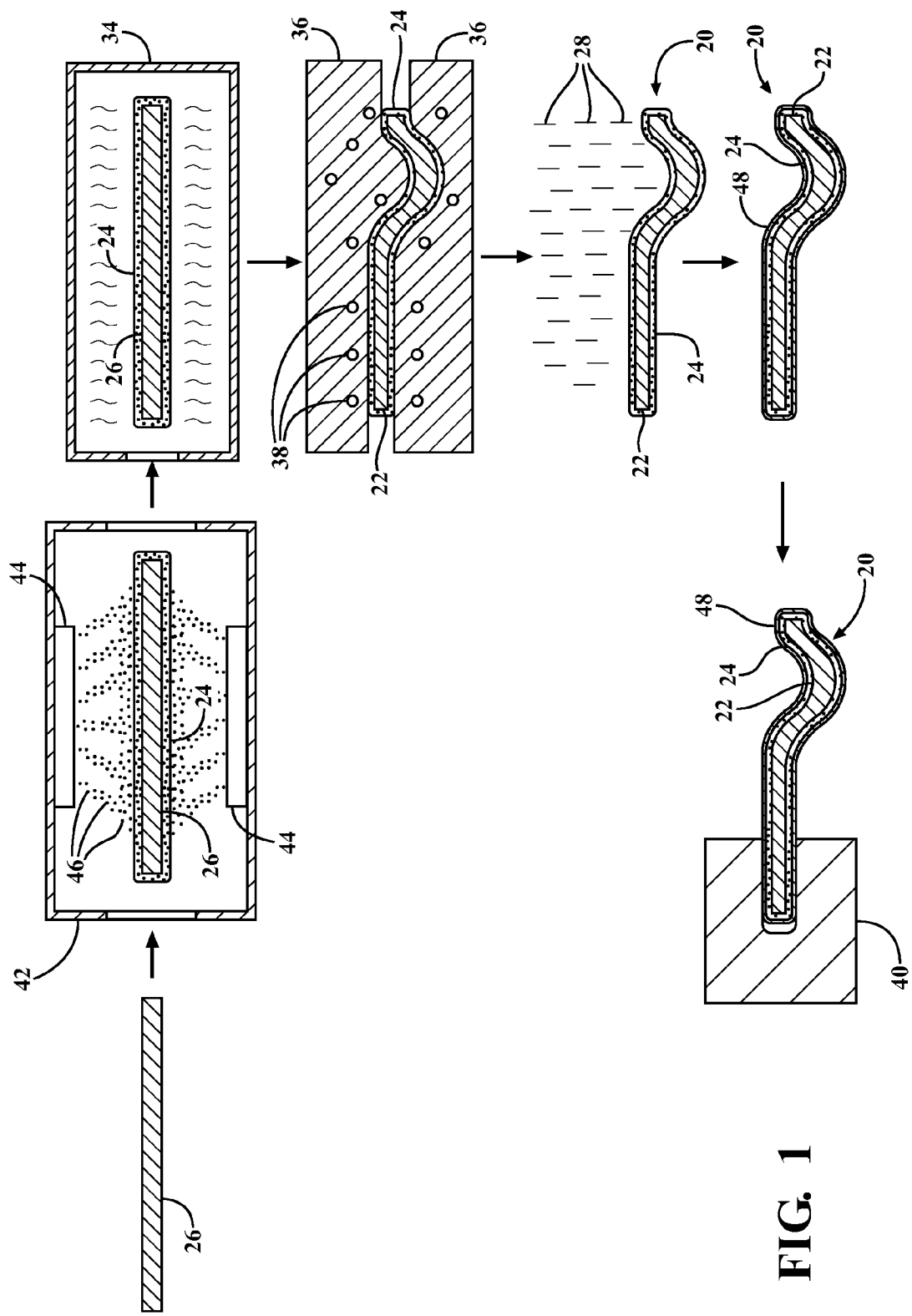
FIG. 1 illustrates a method of forming an automotive vehicle component according to one exemplary embodiment.

A method of forming an automotive vehicle component 20 comprising a steel part 22 coated with a non-metallic coating 24 is generally shown in FIG. 1. The coated automotive component 20 is formed by applying the non-metallic coating 24 to a blank 26 formed of a steel material, preferably by physical vapor deposition (PVD) or reactive sputtering, prior to hot forming the steel blank 26. The non-metallic coating 24 prevents scaling, fouling, corrosion, oxidation, and decarburization of the steel blank 26 during the hot forming process. The non-metallic coating 24 also lubricates and thus enhances formability of the steel blank 26; adjusts the surface color and reflection factor to provide quicker heating of the steel blank 26; and improves adhesion of paint and adhesives. Further, the process of applying the non-metallic coating 24 to the steel blank 26 is environmentally friendly and requires little energy.

The method of forming the automotive components 20 first includes providing the uncoated blank 26 formed of the steel material. The steel material used to form the blank 26 can be pure steel or any type of steel alloy. The blank 26 is preferably a sheet of the steel material, as shown in FIG. 1, formed by hot rolling, cold rolling, or another process known in the art. Hot rolling may include passing a steel stock, such as a slab, bloom, or billet, through a pair of rollers at a temperature above the recrystallization temperature of the steel to form a sheet of the steel. Cold rolling includes passing the steel stock through a pair of rollers at a temperature below the recrystallization temperature of the steel stock to form the steel sheet. In one preferred embodiment, the steel blank 26 is cold rolled boron steel, referred to 22MnB5, and has a microstructure including ferrite and perlite.

Figure 2:
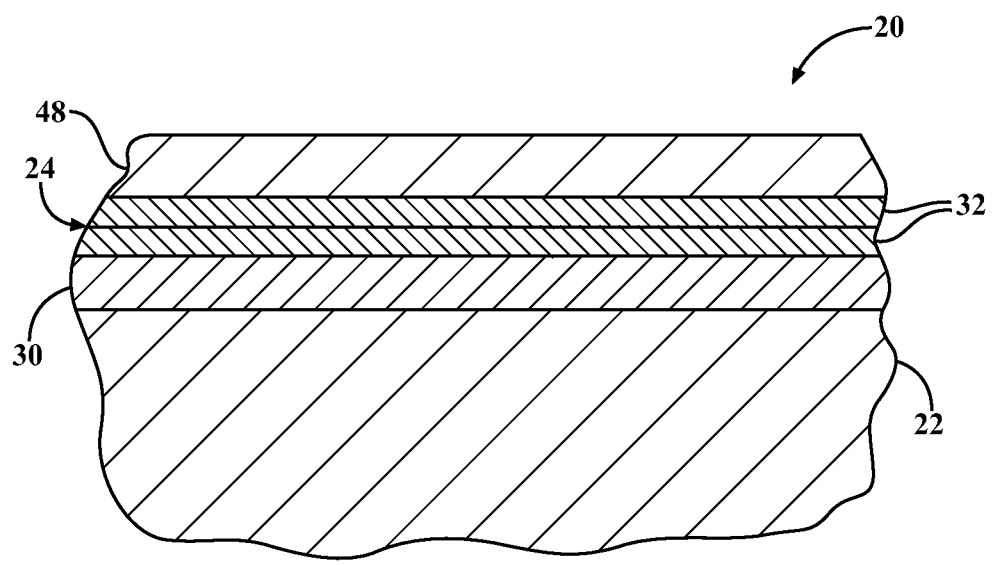
FIG. 2 is a cross-sectional view of a portion of the automotive vehicle component according to another exemplary embodiment.

A metallic coating 30, or another type of coating, can also be disposed on the blank 26 before the non-metallic coating 24, to improve formability and provide quicker heating. For example, a metallic coating 30 comprising zinc can be applied to the steel blank 26 before the non-metallic coating 24 is applied. FIG. 2 is a cross-sectional view of a portion of an automotive vehicle component 20, according to another exemplary embodiment different from the embodiment of FIG. 1. In the embodiment of FIG. 2, a metallic coating 30 is disposed between the steel part 22 and the non-metallic coating 24. In addition, a corrosion protection layer can be applied to the blank 26 to prevent corrosion and rust.

After providing the steel blank 26, the method includes applying the non-metallic coating 24 directly on the surface of the steel blank 26 or on the metallic coating 30. The steel blank 26 is cleaned and dried or otherwise prepared prior to the coating application. Physical vapor deposition (PVD) or reactive sputtering is typically used to apply the non-metallic coating 24. In one embodiment, a metallic coating 30 formed of zinc is applied to the steel blank 26 followed by a PVD top coat, wherein the PVD top coat is the non-metallic coating 24. The zinc coating and PVD top coat prevents white oxide formation during the hot forming step. Thus, shot blasting to remove the white oxides can be avoided.

The non-metallic coating 24 includes at least one of silicon and carbon. Preferably, the non-metallic coating 24 includes either silicon or carbon, but the non-metallic coating 24 can include both silicon and carbon. The silicon is typically present in an amount of 40 to 70 weight percent (wt. %), and the carbon is present in an amount up to 15 wt. %, based on the total weight of the non-metallic coating 24. The non-metallic coating 24 can also include at least one of oxygen and nitrogen, and typically includes both oxygen and nitrogen. The combined amount of oxygen and nitrogen is not greater than 50 wt. %, based on the total weight of the non-metallic coating 24. Further, the non-metallic coating 24 may include at least one of a ceramic compound and a carbide to enhance resistance to high temperature scaling and resistance to corrosion. The ceramic compound may be $SiO_xN_y$, and the carbide may be $CN_x$, wherein x, y, and z are positive integers or fractions. The non-metallic coating 24 may also include $SiC_xO_yN_z$. The non-metallic coating 24 is free of metal and metal containing components, such as $Al_2O_3$, $TiO_2$, and $CrN_x$.

The non-metallic coating 24 includes a plurality of distinct layers 32, preferably one to three distinct layers 32, and more preferably two distinct layers 32, as shown in FIG. 2. The layers 32 together have a total thickness of not greater than 300 nm, and preferably not greater than 100 nm. In one exemplary embodiment, the layers 32 together have a total thickness of not greater than 50 nm. In another embodiment, the layers 32 together have a total thickness of not greater than 30 nm. The low thickness of the non-metallic coating 24 provides less internal stress on each layer 32 and low production costs. The small thickness of the non-metallic coating 24 also contributes to exceptional behavior, formability, and improved performance during the hot forming process.

Each layer 32 of the non-metallic coating 24 includes at least one of silicon and carbon. Each layer 32 may also include at least one of oxygen and nitrogen, and at least one of a ceramic compound and a carbide. However, each layer 32 of the non-metallic coating 24 preferably has a composition or stoichiometry different from the other layers 32. Forming the layers 32 to have different compositions or stoichiometries reduces the length of any pinholes, increases the density of the stack of layers 32, and contributes to the improved corrosion resistance. Further, each layer 32 may comprise a gradient, wherein the amount of one or more constituents increases or decreases with increasing thickness of the layer 32 to provide a denser columnar growth.

The first layer 32 disposed directly on the surface of the steel blank 26 or on the metallic coating 30 may have a thickness that is less than, greater than, or equal to the thickness of the other layers 32. Preferably, the first layer 32 is not greater than three nanometers in thickness, which provides exceptional adhesion between the steel surface and the other layers 32 of the non-metallic coating 24. The second layer 32 is disposed directly on the first layer 32 and typically has a thickness greater than the first layer 32, such as more than three nanometers. However, the second layer 32 may have a thickness less than or equal to the first layer 32.

The non-metallic coating 24 may be provided or prepared according to a variety of methods known in the art. The non-metallic coating 24 is applied to the steel blank 26 by a process capable of providing very thin layers 32, such as physical vapor deposition (PVD) or reactive sputtering. The process of applying the non-metallic coating 24 to the steel blank 26 is also environmentally friendly, requires little energy, and uses no hydrogen.

A variety of different PVD processes may be used to apply the non-metallic coating 24 to the steel blank 26. As shown in FIG. 1, the PVD process typically includes placing the steel blank 26 in a vacuum chamber 42 along with a source material 44 consisting of the non-metallic material used to form the non-metallic coating 24. The method next includes bombarding the source material 44 with a high energy source, such as a beam of electrons or ions, to vaporize the source material 44. Vaporized atoms 46 of the source material travel through the vacuum chamber 42 and deposit on the steel blank 26 to form the non-metallic coating 24.

Reactive sputtering includes placing the source material 44 and the steel blank 26 in the vacuum chamber 42 and introducing a gas, typically a reactive gas and an inert gas, into the vacuum chamber 42. A chemical reaction occurs between the source material 44 and the reactive gas, which causes the source material 44 to deposit on the steel blank 26 and form the non-metallic coating 24. The composition, stoichiometry, or properties of the non-metallic coating 24 may be controlled by varying the relative pressures of the inert and reactive gases.

The steel blanks 26 may be coated individually, such that all surfaces and the edges of the blank are coated. According to another embodiment, the non-metallic coating 24 is applied in the form of a coil to a sheet of the steel material, and after the non-metallic coating 24 is applied, the coated sheet is stamped to provide a coated steel blank 26. In this embodiment, the non-metallic coating 24 would only be disposed on the top and bottom surfaces of the steel blank 26, and not along edges of the steel blank 26.

Once the non-metallic coating 24 is applied to the surface of the steel blank 26, the method of forming the automotive component 20 includes preparing the coated steel blank 26 for the hot forming process. The hot forming process employs high temperatures, and typically temperatures of at least 700° C.

The hot forming process used to form the automotive component 20 typically includes hot stamping the coated steel blank 26. Hot stamping may include disposing the coated steel blank 26 in a furnace or oven 34, as shown in FIG. 1, and heating the coated steel blank 26 to a temperature sufficient to form an austenite phase in the steel material. In one embodiment, the coated steel blank 26 is heated to a temperature of at least 700° C., and preferably 700 to 950° C. In another embodiment, the coated steel blank 26 is heated to a temperature of 900° C. The non-metallic coating 24 can have a color and reflection factor providing quicker heating of the steel blank 26 in the furnace, compared to uncoated steel blanks, or those having a different type of coating.

Next, the heated blank 26 is quickly transferred to a press and disposed between a pair of dies 36, as shown in FIG. 1. The method typically includes stamping the blank 26 between the dies 36, while the blank 26 is still hot, to form the blank 26 into a part 22 having a predetermined shape and dimension. The hot stamped part 22 is then quenched or cooled between the dies 36. The dies 36 typically include cooling channels 38 for the quenching step. The steel material of the hot stamped part 22 typically has a martensitic microstructure after the quenching step.

During the hot forming process, the non-metallic coating 24 prevents or reduces scaling, fouling, corrosion, oxidation, and decarburization of the surface of the part 22. The non-metallic coating 24 also lubricates the surface and thus enhances formability.

Once the hot formed part 22 with the non-metallic coating 24 cools off, the coated part 22 may be used as the automotive vehicle component 20. In the embodiment of FIG. 1, another material, such as an adhesive or paint 48, may be applied to the coated steel part 22. The non-metallic coating 24 provides for improved adhesion of the paint 48 or adhesive to the steel part 22, compared to uncoated parts or parts having other types of coatings. In addition, the non-metallic coating 24 may provide improved welding. Thus, the hot formed part 22 may be welded to another part 40 to provide the finished automotive vehicle component 20, as shown in FIG. 1.

Figure 3:
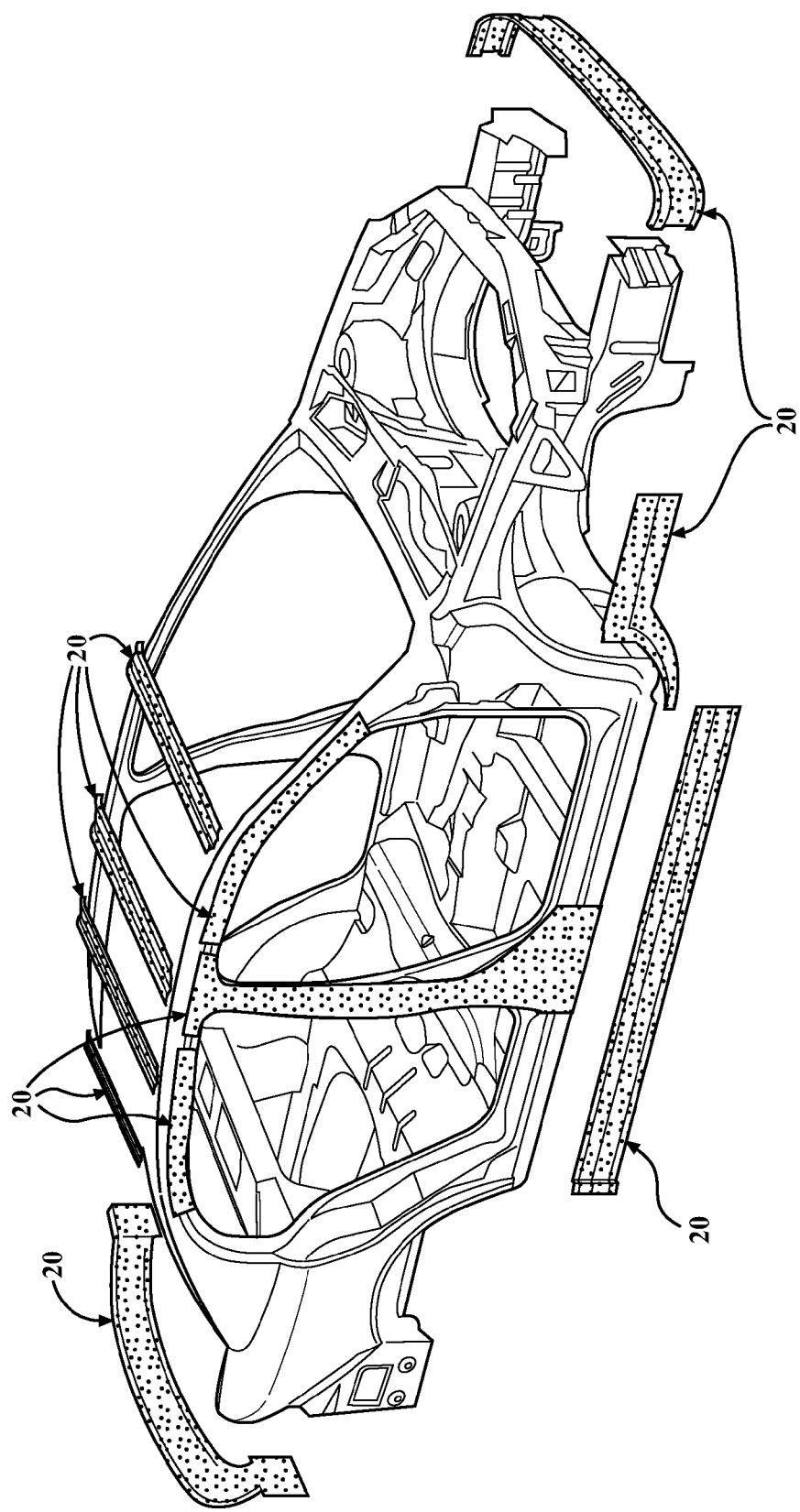
FIG. 3 is a perspective view of other exemplary automotive components formed by the method of the present invention.

The automotive vehicle component 20 including the non-metallic coating 24 disposed on the hot formed part 22 can be an A-pillar, B-pillar, D-pillar, door beam, bumper beam, sill, rocker, fuel tank guard, skid shield, front rail, mid rail, rear rail, door frame, door inner reinforcement, front tunnel, or wet area component. Examples of automotive components 20 formed according to the present invention are shown in FIG. 3. The other components shown in FIG. 3 are uncoated, but could also be coated with the non-metallic coating 24.

Obviously, many modifications and variations of the present invention are possible in light of the above teachings and may be practiced otherwise than as specifically described while within the scope of the appended claims.

The invention claimed is:

1. An automotive component, comprising:
a hot formed part formed of a steel material, and
a non-metallic coating disposed on the part, the non-metallic coating including a plurality of distinct layers, each of the layers including at least one of silicon and carbon, and each of the layers having a composition or stoichiometry different from the other layers, and wherein the layers of the non-metallic coating together have a thickness of not greater than 300 nm.

2. The automotive component of claim 1, wherein the non-metallic coating is free of metal and includes silicon in an amount of 40 to 70 weight percent (wt. %); carbon in an amount up to 15 wt. %; and at least one of oxygen and nitrogen in a combined amount of under 50 wt. %.

3. The automotive component of claim 1, wherein the non-metallic coating includes at least one of a ceramic and a carbide.

4. The automotive component of claim 1, wherein the non-metallic coating is disposed on a surface of the part and adjusts the reflection factor of the surface of the part.

5. The automotive component of claim 1 including a metallic coating disposed between the part and the non-metallic coating.

6. The automotive component of claim 5, wherein the metallic coating includes zinc.

7. The automotive component of claim 1, wherein the steel material of the part is 22MnB5.

8. The automotive component of claim 1, wherein the component is an A-pillar, B-pillar, D-pillar, door beam, bumper beam, sill, rocker, fuel tank guard, skid shield, front rail, mid rail, rear rail, door frame, door inner reinforcement, front tunnel, or wet area component.

9. The automotive component of claim 1, wherein the hot formed part is formed by hot-forming a steel blank, and the non-metallic coating is applied to the steel blank prior to the hot-forming step.

10. The automotive component of claim 1, wherein the non-metallic coating includes carbon and at least one of oxygen and nitrogen.

\* \* \* \* \*